(12) United States Patent
Chen

(10) Patent No.: US 10,816,880 B2
(45) Date of Patent: Oct. 27, 2020

(54) PROJECTION DEVICE

(71) Applicant: Coretronic Corporation, Hsin-Chu (TW)

(72) Inventor: Chia-Tien Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/398,287

(22) Filed: Apr. 30, 2019

(65) Prior Publication Data

US 2019/0361328 A1 Nov. 28, 2019

(30) Foreign Application Priority Data

May 24, 2018 (CN) .................. 2018 2 0780838 U

(51) Int. Cl.
*G03B 21/14* (2006.01)
*H03K 17/97* (2006.01)
*H04N 9/31* (2006.01)

(52) U.S. Cl.
CPC .......... *G03B 21/145* (2013.01); *H03K 17/97* (2013.01); *H04N 9/3194* (2013.01)

(58) Field of Classification Search
CPC ................ G03B 21/00–64; G03B 7/26; H04N 9/31–3197
See application file for complete search history.

(56) References Cited

U.S. PATENT DOCUMENTS

| 2004/0196442 | A1* | 10/2004 | D'Alessio | G03B 21/2086 353/85 |
| 2006/0208576 | A1* | 9/2006 | Tseng | G03B 7/26 307/113 |
| 2009/0085558 | A1* | 4/2009 | David | G01D 5/145 324/207.2 |
| 2009/0109350 | A1* | 4/2009 | Koyama | H04N 9/3155 348/759 |
| 2013/0279028 | A1* | 10/2013 | Liu | G02B 23/16 359/813 |

FOREIGN PATENT DOCUMENTS

| CN | 205015595 U | 2/2016 |
| CN | 205880472 U | 1/2017 |

* cited by examiner

*Primary Examiner* — Michelle M Iacoletti
*Assistant Examiner* — Christopher A Lamb, II

(57) ABSTRACT

A projection device, includes a housing including an opening, a projection lens disposed in the housing, a lens cover module including a lens cover, and a Hall switch including a Hall sensor and a magnet. The lens cover shields the opening when the lens cover is in the closed position, and the housing exposes the opening and exposes the projection lens when the lens cover is in the open position. The Hall sensor is disposed on one of the housing and the lens cover, and the magnet is disposed on the other one of the lens cover and the housing corresponding to the Hall sensor. The Hall switch generates a first control signal when the lens cover is moved from the closed position to the open position. The Hall switch generates a second control signal when the lens cover is moved from the open position to the closed position.

7 Claims, 5 Drawing Sheets

PROJECTION DEVICE

FIELD OF THE INVENTION

The invention relates to a projection device, and more particularly to a projection device that can turn the power on or off by a lens cover.

BACKGROUND OF THE INVENTION

The projection device is a device that can project an image onto a projection screen for presentation to a user, and the projection lens of the projection device is the important component that directly affects the quality of the image projected. In order to prevent the projection lens from being damaged by external force or dust, the conventional projection device is generally provided with a separate lens cover or protection cover. However, the separate lens cover has problems in operation and loss, and the overall appearance is not beautiful.

Some conventional projection devices are equipped with built-in lens covers to prevent the loss of the lens covers, and the overall appearance of the projection devices is more beautiful. However, the lens cover of the conventional projection device still has lots of room for improvement in operation, and how to make the use of the projection device more intuitive and convenient is the focus of attention of the relevant personnel in the field.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

An objective of the invention is to provide a projection device, which has a lens cover module capable of turning on or off the power, can simplify the operation of turning on or off, and achieves the effect of fast turning on or off.

Other objectives and advantages of the invention may be further illustrated by the technical features disclosed in the invention.

In order to achieve one or a portion of or all of the objectives or other objectives, an embodiment of the invention provides a projection device, including a housing, a projection lens, a lens cover module, and a Hall switch. The housing includes an opening. The projection lens is disposed in the housing. The lens cover module includes a lens cover, and the lens cover is movably disposed on the housing. The lens cover moves relative to the housing between an open position and a closed position, wherein the lens cover shields the opening when the lens cover is in the closed position, and the housing exposes the opening and exposes the projection lens when the lens cover is in the open position. The Hall switch includes a Hall sensor and a magnet. The Hall sensor is disposed on one of the housing and the lens cover, and the magnet is disposed on the other one of the lens cover and the housing corresponding to the Hall sensor. The Hall switch generates a first control signal when the lens cover is moved from the closed position to the open position. The Hall switch generates a second control signal when the lens cover is moved from the open position to the closed position.

The projection device of the invention is provided with a Hall switch, and can be turned on and off by the opening and closing of the lens cover, so that the use of the projection device is more intuitive and convenient.

Other objectives, features and advantages of The invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1A:
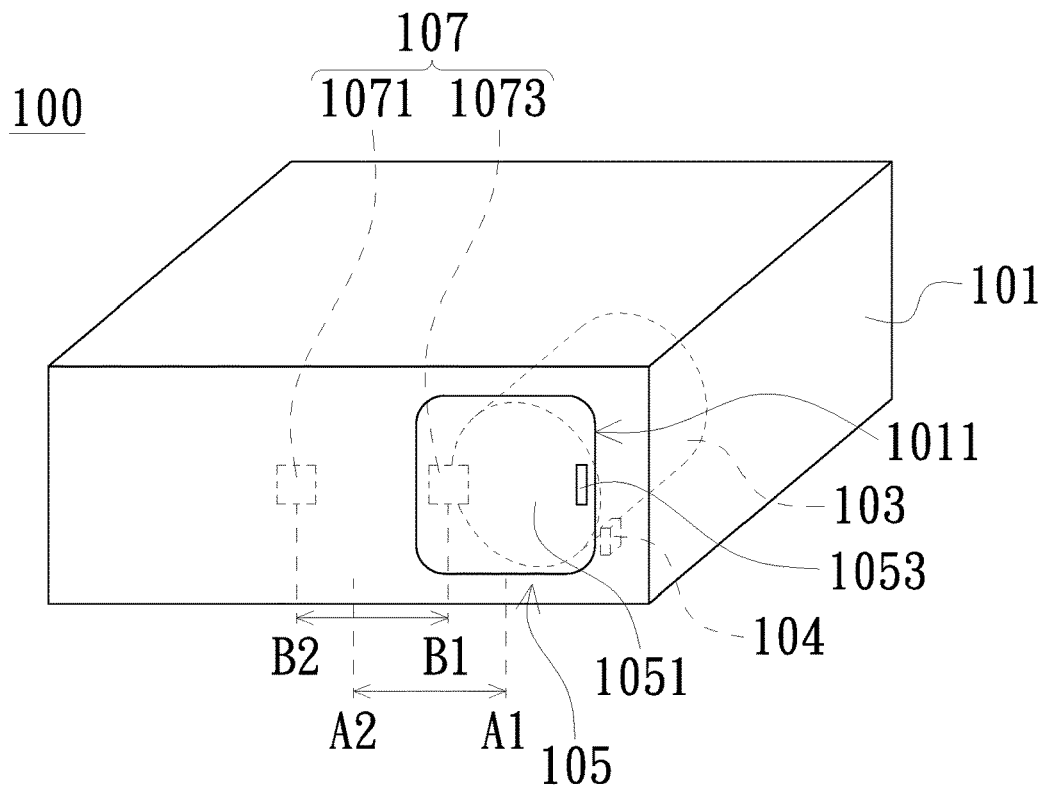
FIG. 1A shows a schematic diagram of a projection device according to an embodiment of the invention in the turning off state.
Figure 1B:
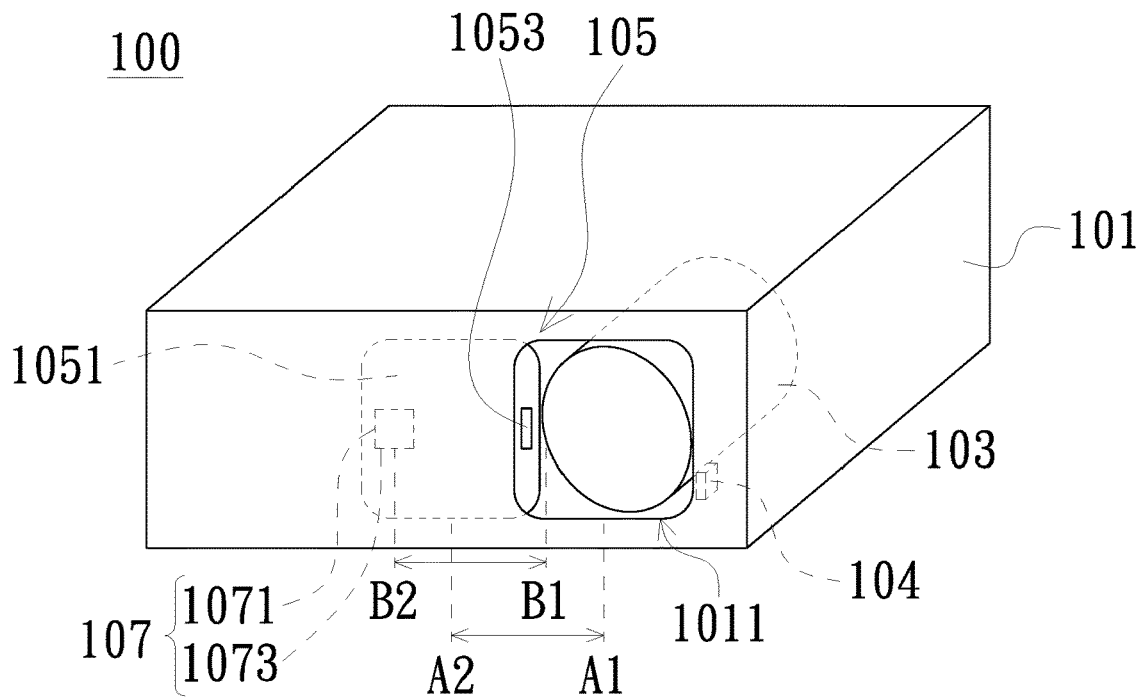
FIG. 1B shows a schematic diagram of a projection device according to an embodiment of the invention in the turning on state.

Referring to FIG. 1A and FIG. 1B, which are the schematic diagrams of a projection device according to an embodiment of the invention in the turning off and turning on states, wherein FIG. 1A is a schematic diagram of the lens cover 1051 in the closed position A1, and FIG. 1B is a schematic diagram of the lens cover 1051 in the open position A2. The projection device 100 of the embodiment includes a housing 101, a projection lens 103, a lens cover module 105, and a Hall switch 107. The housing 101 includes an opening 1011. The projection lens 103 is disposed in the housing 101. The lens cover module 105 includes a lens cover 1051. The lens cover 1051 is movably disposed on the housing 101. The lens cover 1051 moves relative to the housing 101 between an open position A2 and a closed position A1, wherein the lens cover 1051 shields the opening 1011 when the lens cover 1051 is in the closed position A1. When the lens cover 1051 is in the open position A2, the lens cover 1051 slides into the housing 101, and the housing 101 exposes the opening 1011 and exposes the projection lens 103. When the projection device 100 is in operation, the projection lens 103 projects an image beam (not shown) from the opening 1011 to the outside of the housing 101 to project the image beam onto the projection screen for the user to watch.

The Hall switch 107 includes a Hall sensor 1071 and a magnet 1073. The Hall sensor 1071 is disposed on the housing 101 or the lens cover 1051, and the magnet 1073 is disposed on the lens cover 1051 or the housing 101 corresponding to the Hall sensor 1071. In the embodiment, the Hall sensor 1071 is disposed on the housing 101, and the magnet 1073 is disposed on the lens cover 1051 as an example. The Hall switch 1071 will generate a first control signal when the lens cover 1051 is moved from the closed position A1 to the open position A2; and the Hall switch 107 will generate a second control signal when the lens cover 1051 is moved from the open position A2 to the closed position A1. The first control signal, for example, could be a power-on signal, and the second control signal, for example, could be a power-off signal. By the setting of the Hall switch 107, the projection device 100 can automatically turn on and turn off by the opening and closing of the lens cover 1051. The detailed description will be presented later in the specification.

Figure 2:
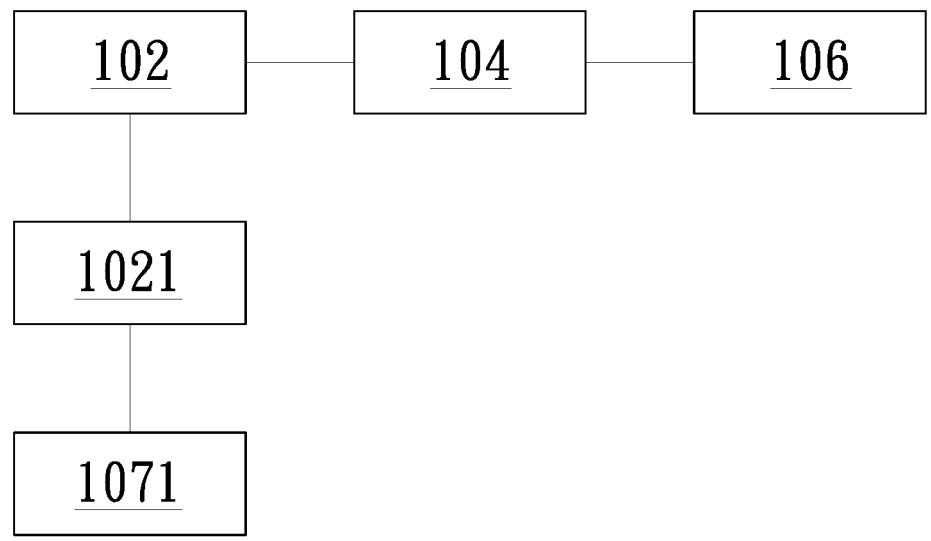
FIG. 2 is a block diagram of a projection device according to an embodiment of the invention.

Referring to FIG. 2, which is a block diagram of a projection device according to an embodiment of the invention. The projection device 100 could further include a projection circuit board 102 (or a processor) and a voltage sensor 1021, and the voltage sensor 1021 is electrically coupled to the Hall sensor 1071 and the projection circuit board 102. The projection circuit board 102 is electrically coupled to the power supply 106. As shown in FIG. 1A, the Hall sensor 1071 and the magnet 1073 are in a remote position when the lens cover 1051 is in the closed position A1. At this time, the magnet 1073 is located at the position B1, and the Hall sensor 1071 is located at the position B2. As shown in FIG. 1B, the Hall sensor 1071 and the magnet 1073 are in an approximate position when the lens cover 1051 is in the open position A2. At this time, the Hall sensor 1071 and the magnet 1073 are both located near the position B2.

Figure 3A:
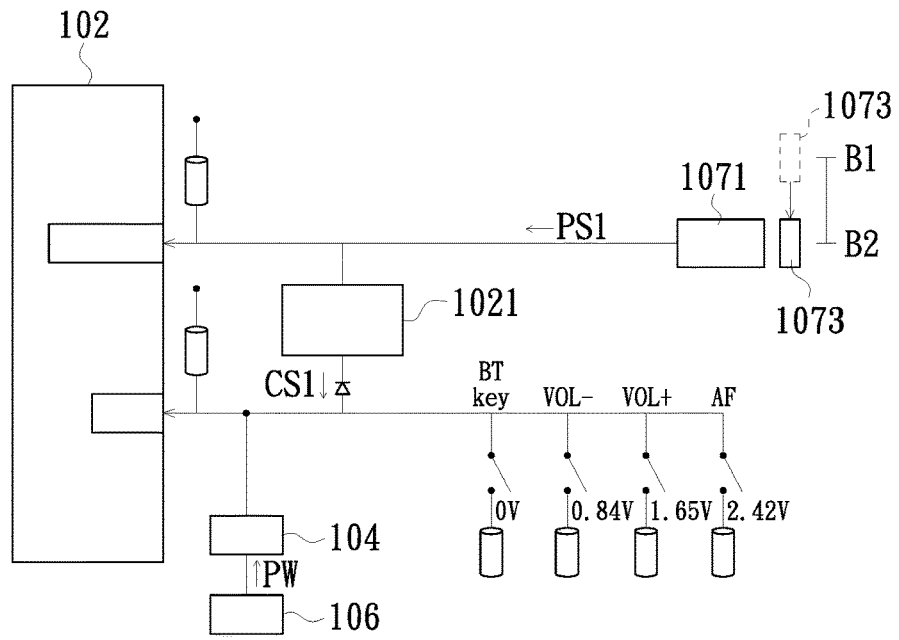
FIG. 3A and FIG. 3B are schematic diagrams showing the circuit operation of a projection device according to an embodiment of the invention.
Figure 3B:
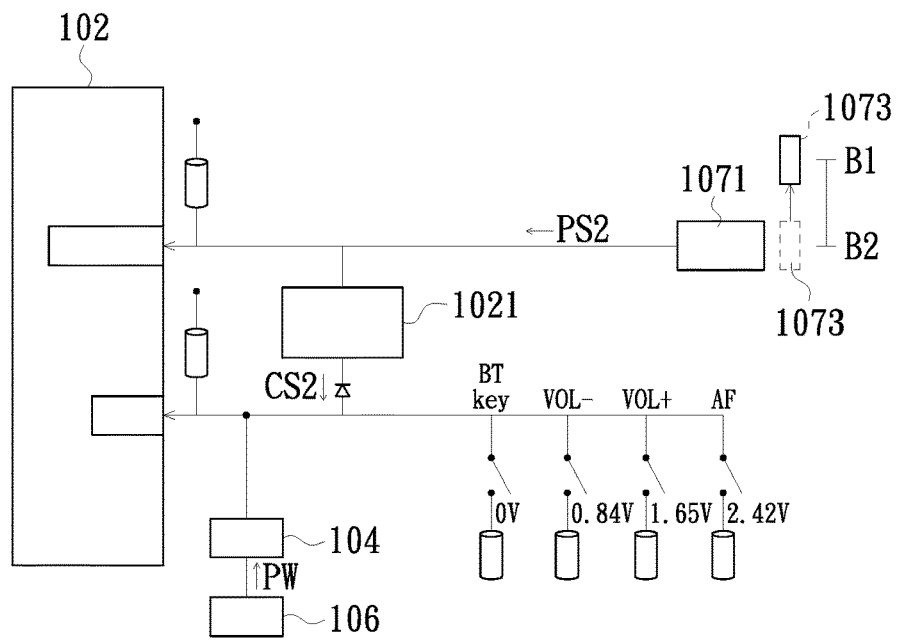

Referring to FIG. 3A and FIG. 3B, which are schematic diagrams showing the circuit operation of a projection device according to an embodiment of the invention, wherein FIG. 3A shows the circuit operation diagram when the lens cover 1051 is opened, and FIG. 3B shows the circuit operation diagram when the lens cover 1051 is closed. As shown in FIG. 3A, when the lens cover 1051 is moved from the closed position A1 to the open position A2, the Hall sensor 1071 and the magnet 1073 are moved from the remote position to the approximate position, and the Hall sensor 1071 generates a first pulse voltage PS1. The voltage sensor 1021 receives the first pulse voltage PS1 and generates the first control signal CS1 according to the first pulse voltage PS1. The projection circuit board 102 receives the first control signal CS1 and turns on the operation of the projection device 100 according to the first control signal CS1. In this way, the projection device 100 can be automatically turned on by opening the lens cover 1051. As shown in FIG. 3B, when the lens cover 1051 is moved from the open position A2 to the closed position A1, the Hall sensor 1071 and the magnet 1073 are moved from the approximate position to the remote position, and the Hall sensor 1071 generates a second pulse voltage PS2. The voltage sensor 1021 receives the second pulse voltage PS2 and generates the second control signal CS2 according to the second pulse voltage PS2. The projection circuit board 102 receives the second control signal CS2 and turns off the operation of the projection device 100 according to the second control signal CS2. In this way, the projection device 100 can be automatically turned off by closing the lens cover 1051.

The first control signal CS1, for example, could be a voltage level signal of 0V, and the second control signal CS2, for example, could be a voltage level signal of 3.3V. The projection circuit board 102 turns on the operation of the projection device 100 when receiving a voltage level signal of 0V. The projection circuit board 102 turns off the operation of the projection device 100 when receiving a voltage level signal of 3.3V.

In the embodiment, when the projection circuit board 102 turns on the operation of the projection device 100 in accordance with the first control signal CS1, the power supply 106 provides a power PW required for the operation of the projection circuit board 102. The power supply 106 is electrically coupled to the projection circuit board 102, and provides the power PW required for operation is only an example, to which the invention is not limited.

The components, circuits and their connections shown in FIG. 2 to FIG. 3B are merely exemplified, to which the invention is not limited. In the projection device 100 of the embodiment, as long as the Hall switch 107 can generate the first control signal CS1 when the lens cover 1051 is moved from the closed position A1 to the open position A2, the Hall switch 107 can generate the second control signal CS2 when the lens cover 1051 is moved from the open position A2 to the closed position A1, and the projection device 100 can be turned on according to the first control signal CS1 and turned off according to the second control signal CS2 is sufficient.

Incidentally, the first control signal CS1 also could be other functional signals other than the power-on signal, and the second control signal CS2 also could be other functional signals other than the power-off signal. For example, the first control signal CS1 could be a bulb warm-up signal, and the light source device of the projection device 100 for providing the light source, such as a light emitting diode or a lamp (not shown in the figures), could be preheated when the lens cover 1051 is opened. For example, the second control signal CS2 could be a standby signal, and when the lens cover 1051 is closed, the projection device 100 could enter a standby mode, that is, the light source device does not provide the light source.

In addition, the projection device 100, for example, could further include an interlock 104 electrically connected between the projection circuit board 102 and the power supply 106. The interlock 104, for example, could be disposed on the lens cover 1051 or the housing 101, to which the invention is not limited. As shown in FIG. 1A and FIG. 1B, in the embodiment, the interlock 104 is disposed on the housing 101 as an example. When the lens cover 1051 is in the closed position A1, the interlock 104 is in an circuit opening (to break) state to form an open circuit between the power supply 106 and the projection circuit board 102. When the lens cover 1051 is in the open position A2, the interlock 104 is in a circuit closing (to make) state to form a closed circuit between the power supply 106 and the projection circuit board 102, and the power supply 106 provides the power PW required for the operation of projection circuit board 102. In this way, by the arrangement of the interlock 104, when the lens cover 1051 is closed, the electrical connection between the projection circuit board 102 and the power supply 106 is cut off, and the projection device 100 can be turned off.

Specifically, the interlock 104 could include a touch switch (not shown in the figures). When the lens cover 1051 is in the closed position A1, the lens cover 1051 touches the touch switch to make the interlock 104 to be in the circuit opening state. When the lens cover 1051 is in the open position A2, the touch switch does not touch the lens cover 1051, and makes the interlock 104 to be in the circuit closing state.

The lens cover module 105 could also include mechanical or electronic components (not shown in the figures) such as slide rails, guide slots, gears, and/or motors to let the lens cover 1051 move relative to the housing 101 between the open position A2 and the closed position A1. The lens cover 1051, for example, may further include a handle 1053, and the user could operate the handle 1053 to move the lens cover 1051 relative to the housing 101 between the open position A2 and the closed position A1. In addition, the lens cover 1051 of the lens cover module 105 may also automatically move between the open position A2 and the closed position A1 by components such as gears and/or motors. For example, a control signal may be generated by operating a button of the projection device 100 or a remote controller (not shown), and the lens cover module 105 can automatically let the lens cover 1051 open or close according to the control signal. However, the invention does not limit the mechanical or electronic components included in the lens cover module 105, as long as the lens cover 1051 could move relative to the housing 101 between the open position A2 and the closed position A1 is sufficient.

Figure 4A:
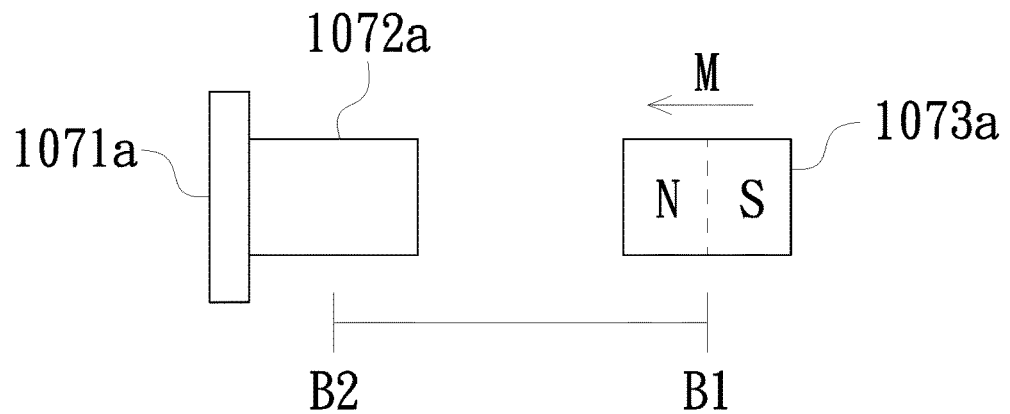
FIG. 4A shows a schematic diagram of an implementation of a Hall switch according to an embodiment of the invention.

Referring to FIG. 4A, which is a schematic diagram of an implementation of a Hall switch according to an embodiment of the invention. The embodiment is an implementation of the Hall switch 107 of the projection device 100 shown in FIG. 1A to FIG. 3B. In the embodiment, the Hall switch 107 is exemplified by a Hall sensor 1071a and a magnet 1073a, and the functions and effects of the Hall sensor 1071a and the magnet 1073a are the same as the Hall sensor 1071 and the magnet 1073 shown in FIG. 1A to FIG. 3B.

The magnet 1073a has a moving direction M, and when the Hall sensor 1071a and the magnet 1073a are moved from the remote position to the approximate position, the magnet 1073a is closer to the Hall sensor 1071a toward the moving direction M, and the Hall sensor 1071a thus generates the first pulse voltage PS1. The Hall sensor 1071a includes an inductive surface 1072a that faces the north pole end of the magnet 1073a.

Figure 4B:
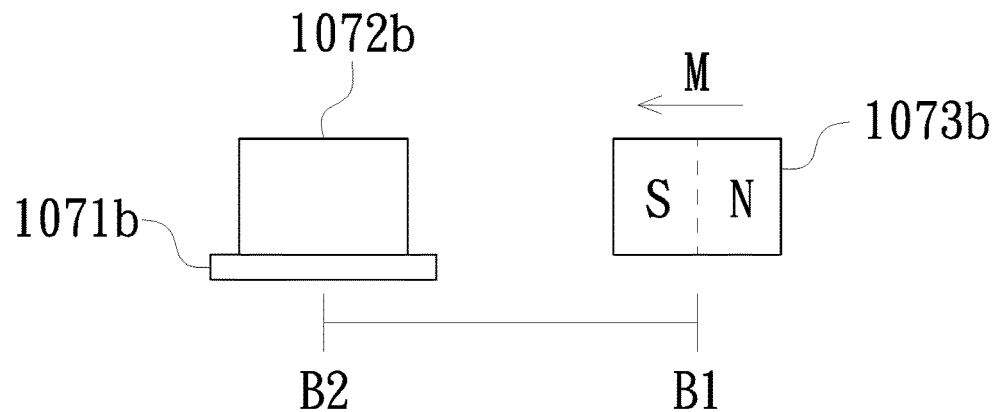
FIG. 4B shows a schematic diagram of another implementation of a Hall switch according to an embodiment of the invention.

Referring to FIG. 4B, which is a schematic diagram of another implementation of a Hall switch according to an embodiment of the invention. The embodiment is an implementation of the Hall switch 107 of the projection device 100 shown in FIG. 1A to FIG. 3B. In the embodiment, the Hall switch 107 is exemplified by a Hall sensor 1071b and a magnet 1073b. The magnet 1073b has a moving direction M, and when the Hall sensor 1071b and the magnet 1073b are moved from the remote position to the approximate position, the normal direction of the inductive surface 1072b of the Hall sensor 1071b is perpendicular to the moving direction M.

Figure 4C:
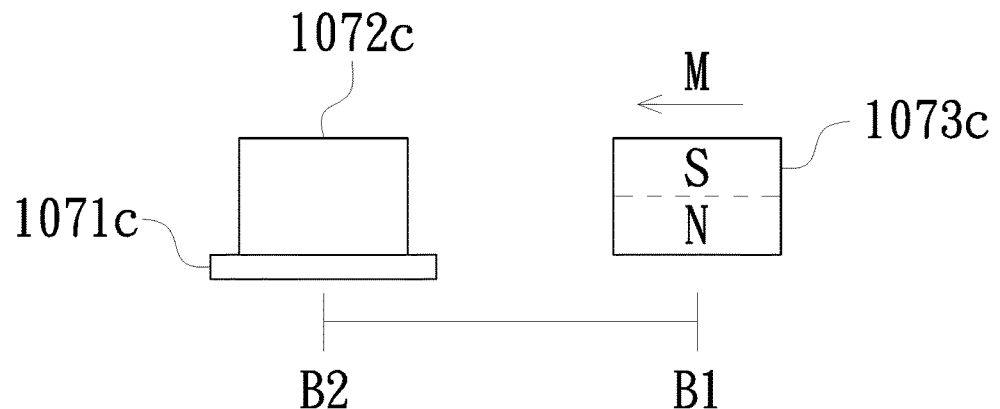
FIG. 4C shows a schematic diagram of still another implementation of a Hall switch according to an embodiment of the invention.

Referring to FIG. 4C, which is a schematic diagram of still another implementation of a Hall switch according to an embodiment of the invention. The embodiment is an implementation of the Hall switch 107 of the projection device 100 shown in FIG. 1A to FIG. 3B. In the embodiment, the Hall switch 107 is exemplified by a Hall sensor 1071c and a magnet 1073c, and the functions and effects of the Hall sensor 1071c and the magnet 1073c are the same as the Hall sensor 1071 and the magnet 1073 shown in FIG. 1A to FIG. 3B. The magnet 1073c has a moving direction M, and when the Hall sensor 1071c and the magnet 1073c are moved from the remote position to the approximate position, the normal direction of the south pole end of the magnet 1073c is parallel to the normal direction of the inductive surface 1072c of the Hall sensor 1071c.

Figure 5:
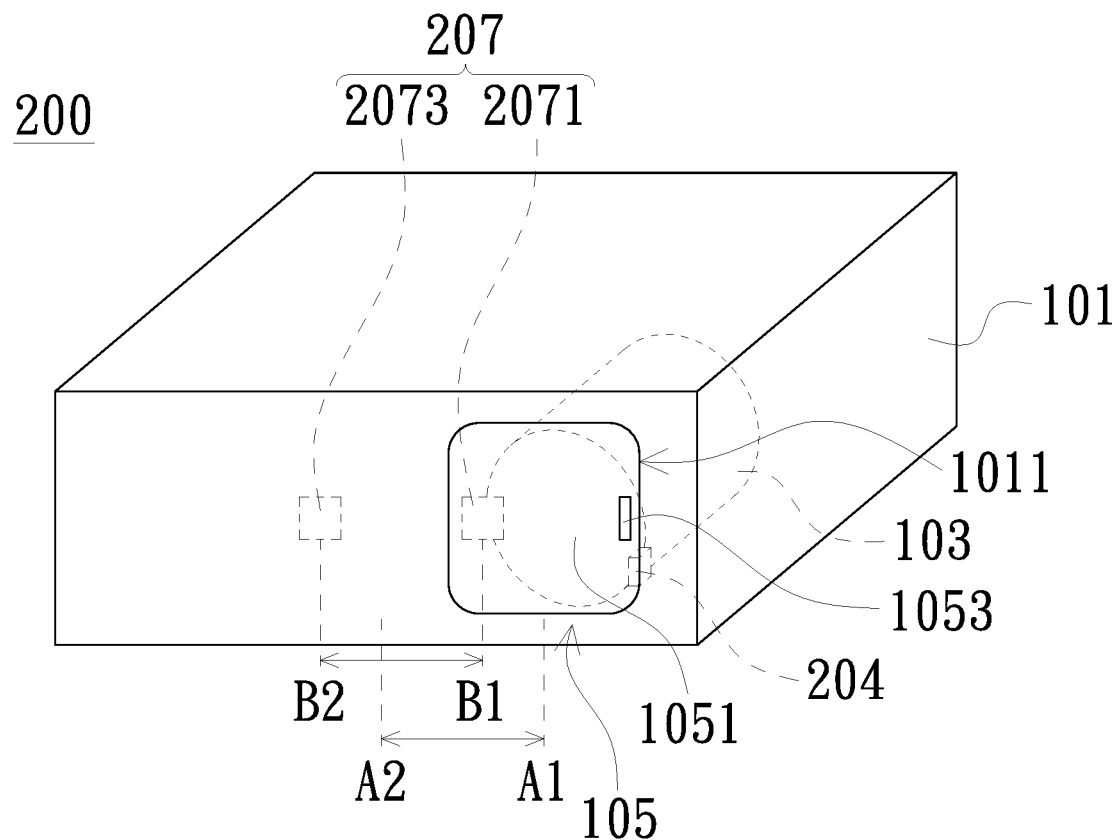
FIG. 5 shows a schematic diagram of a projection device according to another embodiment of the invention.

Referring to FIG. 5, which is a schematic diagram of a projection device according to another embodiment of the invention. In the embodiment, the projection device 200 includes a housing 101, a projection lens 103, a lens cover module 105, an interlock 204, and a Hall switch 207, and the Hall switch 207 includes a Hall sensor 2071 and a magnet 2073. The projection device 200 of the embodiment has a similar structure and function as the projection device 100 shown in FIG. 1A to FIG. 3B. The embodiment shown in FIG. 5 is different from the embodiment shown in FIG. 1A to FIG. 3B in that the Hall sensor 2071 is disposed on the lens cover 1051, and the magnet 2073 is disposed on the housing 101. When the lens cover 1051 is moved from the closed position A1 to the open position A2, the Hall sensor 2071 and the magnet 2073 are moved from the remote position to the approximate position. When the lens cover 1051 is moved from the open position A2 to the closed position A1, the Hall sensor 2071 and the magnet 2073 are moved from the approximate position to the remote position. In this way, by opening and closing the lens cover 1051, the projection device 200 can be turned on and turned off.

In the embodiment, the interlock 204 is disposed on the lens cover 1051 as an example. When the lens cover 1051 is in the closed position A1, the interlock 204 is in an circuit opening (break) state to form an open circuit between the power supply 106 and the projection circuit board 102. When the lens cover 1051 is in the open position A2, the interlock 204 is in a circuit closing (make) state to form a closed circuit between the power supply 106 and the projection circuit board 102.

Specifically, the interlock 204 could include a touch switch (not shown). When the lens cover 1051 is in the closed position A1, the touch switch touches the housing 101 to make the interlock 204 to be in the circuit opening state. When the lens cover 1051 is in the open position A2, the touch switch does not touch the housing 101, and makes the interlock 204 to be in the circuit closing state.

In summary, the projection device of the embodiment of the invention is provided with a Hall switch, and can be turned on and off by the opening and closing of the lens cover, so that the use of the projection device is more intuitive and convenient.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as first control signal, second control signal, first pulse voltage, and second pulse voltage are only used for distinguishing various elements and do not limit the number of the elements.

What is claimed is:

1. A projection device, comprising:
a housing, comprising an opening;
a projection lens, disposed in the housing;
a lens cover module, comprising a lens cover, wherein the lens cover is movably disposed on the housing, and the lens cover moves relative to the housing between an open position and a closed position, the lens cover shields the opening when the lens cover is in the closed position, and the housing exposes the opening and exposes the projection lens when the lens cover is in the open position;
a Hall switch, comprising a Hall sensor and a magnet, wherein the Hall sensor is disposed on one of the housing and the lens cover, the magnet is disposed on the other one of the lens cover and the housing corresponding to the Hall sensor;
a projection circuit board and a voltage sensor, and the voltage sensor is electrically coupled to the Hall sensor and the projection circuit board; and
an interlock and a power supply, the interlock is electrically connected between the projection circuit board and the power supply, and the interlock is disposed on the lens cover or the housing;
wherein the Hall switch generates a first control signal when the lens cover is moved from the closed position to the open position,
wherein the Hall switch generates a second control signal when the lens cover is moved from the open position to the closed position, and the first control signal and the second control signal are different;
wherein the Hall sensor and the magnet are in an approximate position when the lens cover is in the open position, and the Hall sensor and the magnet are in a remote position when the lens cover is in the closed position,
wherein the Hall sensor generates a first pulse voltage when the Hall sensor and the magnet are moved from the remote position to the approximate position, the voltage sensor receives the first pulse voltage and generates the first control signal according to the first pulse voltage, the projection circuit board receives the first control signal and turns on the operation of the projection device according to the first control signal,
wherein the Hall sensor generates a second pulse voltage when the Hall sensor and the magnet are moved from the approximate position to the remote position, the voltage sensor receives the second pulse voltage and generates the second control signal according to the second pulse voltage, the projection circuit board receives the second control signal and turns off the operation of the projection device according to the second control signal;
wherein when the lens cover is in the closed position, the interlock is in an circuit opening state to form an open circuit between the power supply and the projection circuit board,
wherein when the lens cover is in the open position, the interlock is in a circuit closing state to form a closed circuit between the power supply and the projection circuit board, and the power supply provides the power required for operation of the projection circuit board;
wherein the interlock comprises a touch switch,
wherein when the interlock is disposed on the lens cover and the lens cover is in the closed position, the touch switch touches the housing to cause the interlock to be in the circuit opening state, wherein when the interlock is disposed on the housing and the lens cover is in the closed position, the touch switch touches the lens cover to cause the interlock to be in the circuit opening state.

2. The projection device according to claim 1, wherein the projection circuit board is electrically coupled to a power supply, and the power supply provides a power required for operation of the projection circuit board when the projection circuit board turns on the operation of the projection device according to the first control signal.

3. The projection device according to claim 1, wherein the Hall sensor is disposed on the housing, and the magnet is disposed on the lens cover.

4. The projection device according to claim 1, wherein the Hall sensor is disposed on the lens cover, and the magnet is disposed on the housing.

5. The projection device according to claim 1, wherein the magnet has a moving direction, and when the Hall sensor and the magnet are moved from the remote position to the approximate position, the magnet is closer to the Hall sensor toward the moving direction, wherein the Hall sensor comprises an inductive surface that faces the north pole end of the magnet.

6. The projection device according to claim 1, wherein the magnet has a moving direction, and when the Hall sensor and the magnet are moved from the remote position to the approximate position, the magnet is closer to the Hall sensor toward the moving direction, wherein the Hall sensor comprises an inductive surface, and the normal direction of the inductive surface is perpendicular to the moving direction.

7. The projection device according to claim 1, wherein the magnet has a moving direction, and when the Hall sensor and the magnet are moved from the remote position to the approximate position, the magnet is closer to the Hall sensor toward the moving direction, wherein the Hall sensor comprises an inductive surface, and the normal direction of the south pole end of the magnet is parallel to the normal direction of the inductive surface of the Hall sensor.

* * * * *